US007534543B2

(12) United States Patent
Kreilich et al.

(10) Patent No.: US 7,534,543 B2
(45) Date of Patent: May 19, 2009

(54) TEXTURE CONTROL OF THIN FILM LAYERS PREPARED VIA LASER INDUCED THERMAL IMAGING

(75) Inventors: Leslie A. Kreilich, St. Paul, MN (US); Vivian W. Jones, Woodbury, MN (US); Khanh T. Huynh, Eagan, MN (US); John S. Staral, Woodbury, MN (US); Sergey A. Lamansky, Apple Valley, MN (US); Ha T. Le, St. Paul, MN (US); John P. Baetzold, North St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 494 days.

(21) Appl. No.: 11/195,181

(22) Filed: Aug. 2, 2005

(65) Prior Publication Data
US 2005/0287315 A1    Dec. 29, 2005

Related U.S. Application Data

(60) Continuation-in-part of application No. 11/022,963, filed on Dec. 27, 2004, now abandoned, which is a continuation of application No. 10/726,315, filed on Dec. 1, 2003, now Pat. No. 6,866,979, which is a continuation of application No. 10/440,689, filed on May 19, 2003, now abandoned, which is a continuation of application No. 09/738,735, filed on Dec. 15, 2000, now Pat. No. 6,461,793, which is a continuation of application No. 09/553,294, filed on Apr. 20, 2000, now Pat. No. 6,270,934, which is a continuation of application No. 09/349,329, filed on Jul. 8, 1999, now Pat. No. 6,099,994, which is a continuation of application No. 09/031,941, filed on Feb. 27, 1998, now Pat. No. 5,981,136, which is a division of application No. 08/632,225, filed on Apr. 15, 1996, now Pat. No. 5,725,989.

(51) Int. Cl.
G03C 8/00         (2006.01)
G03C 1/492        (2006.01)

(52) U.S. Cl. .................. 430/200; 430/201; 430/271.1

(58) Field of Classification Search .................. 430/200, 430/201, 271.1
See application file for complete search history.

(56) References Cited

U.S. PATENT DOCUMENTS

| | | | |
|---|---|---|---|
| 3,795,814 A | 3/1974 | Rabtin | |
| 3,859,527 A | 1/1975 | Luckey | |
| 3,883,747 A | 5/1975 | Murashige et al. | |
| 3,974,389 A | 8/1976 | Ferri et al. | |
| 4,204,125 A | 5/1980 | Fatuzzo et al. | |
| 4,225,653 A | 9/1980 | Brixner | |
| 4,249,011 A | 2/1981 | Wendling | |
| 4,252,671 A | 2/1981 | Smith | |
| 4,258,264 A | 3/1981 | Kotera et al. | |
| 4,261,854 A | 4/1981 | Kotera et al. | |
| 4,262,072 A | 4/1981 | Wendling et al. | |
| 4,387,141 A | 6/1983 | Patten | |
| 4,405,691 A | 9/1983 | Yale | |
| 4,430,366 A | 2/1984 | Crawford et al. | |
| 4,598,207 A | 7/1986 | Naruse et al. | |
| 4,599,298 A | 7/1986 | Fisch | |
| 4,652,462 A | 3/1987 | Nishizawa et al. | |
| 4,772,583 A | 9/1988 | Sprecker et al. | |
| 4,822,643 A | 4/1989 | Chou et al. | |
| 4,833,124 A | 5/1989 | Lum | |
| 4,839,224 A | 6/1989 | Chou et al. | |
| 4,912,083 A | 3/1990 | Chapman et al. | |
| 4,940,640 A | 7/1990 | MacDiarmid | |
| 4,942,141 A | 7/1990 | DeBoer et al. | |
| 4,948,776 A | 8/1990 | Evans et al. | |
| 4,948,777 A | 8/1990 | Evans et al. | |
| 4,948,778 A | 8/1990 | DeBoer | |
| 4,950,639 A | 8/1990 | DeBoer et al. | |
| 4,952,552 A | 8/1990 | Chapman et al. | |
| 4,973,572 A | 11/1990 | DeBoer | |

(Continued)

FOREIGN PATENT DOCUMENTS

EP         175 578        3/1986

(Continued)

OTHER PUBLICATIONS

"Luminescent Materials", *Ullmanns's Encyclopedia of Industrial Chemistry*, 5$^{th}$ Ed., vol. A15, p. 539-554 (1990).
Bello, K.A. et al., "Near-Infrared-absorbing Squaraine Dyes containing 2,3-Dihydroperimidine Terminal Groups", *J. Chem. Socl, Chem-Commun.*, p. 452-4 (1993).
Chuang, T.J. et al., "Laser-Photoetching Characteristics of Polymers with Dopants", *Appl. Phys. A*, 45, p. 277-288 (1988).
Curtin, C., et al., *Fundamentals of Emissive Technology*, Society for Information Display.
Hase, T. et al., "Phosphor Materials for Cathode-Ray Tubes," *Advances in Electronic and Electron Physics*, Academic Press, Inc., New York, 79, 271 (1990).
Irie et al., "Thermal Transfer Color Printing Using Laser Heating", *Journal of Imaging Science and Technology*, 37, 235-238 (May/Jun. 1993).

(Continued)

Primary Examiner—Geraldina Visconti
(74) Attorney, Agent, or Firm—Lance L. Vietzke

(57) ABSTRACT

A thermal transfer donor element is provided which includes a support, light-to-heat conversion layer, interlayer, and thermal transfer layer. When the donor element is brought into contact with a receptor and imagewise irradiated, a portion of the transfer layer is transferred to the receptor. The relative surface texture of the layers can be at least partially controlled, prior to imaging of the donor element, for desired effects in the resulting receptor device. The construction and process of the donor element is useful in making colored images including applications such as color proofs, color filter elements, and organic light emitting displays.

4 Claims, 3 Drawing Sheets

U.S. PATENT DOCUMENTS

| | | | |
|---|---|---|---|
| 5,023,229 A | 6/1991 | Evans et al. |
| 5,024,990 A | 6/1991 | Chapman et al. |
| 5,089,372 A | 2/1992 | Kirihata et al. |
| 5,124,564 A | 6/1992 | Fouassier et al. |
| 5,156,938 A | 10/1992 | Foley et al. |
| 5,164,224 A | 11/1992 | Kojima et al. |
| 5,166,024 A | 11/1992 | Bugner et al. |
| 5,171,650 A | 12/1992 | Ellis et al. |
| 5,256,506 A | 10/1993 | Ellis et al. |
| 5,278,023 A | 1/1994 | Bills et al. |
| 5,286,604 A | 2/1994 | Simmons, III |
| 5,296,117 A | 3/1994 | De Jaeger et al. |
| 5,302,423 A | 4/1994 | Tran et al. |
| 5,306,637 A | 4/1994 | Lin et al. |
| 5,308,737 A | 5/1994 | Bills et al. |
| 5,340,699 A | 8/1994 | Haley et al. |
| 5,351,617 A | 10/1994 | Williams et al. |
| 5,352,562 A | 10/1994 | Takahashi et al. |
| 5,360,694 A | 11/1994 | Thien et al. |
| 5,401,606 A | 3/1995 | Reardon et al. |
| 5,401,607 A | 3/1995 | Takiff et al. |
| 5,501,937 A | 3/1996 | Matsumoto et al. |
| 5,534,383 A | 7/1996 | Takahashi et al. |
| 5,725,989 A | 3/1998 | Chang et al. |
| 5,757,313 A | 5/1998 | Meneghini et al. |
| 5,981,136 A | 11/1999 | Chang et al. |
| 6,099,994 A | 8/2000 | Chang et al. |
| 6,190,826 B1 | 2/2001 | Chang et al. |
| 6,270,934 B1 | 8/2001 | Chang et al. |
| 6,461,793 B2 | 10/2002 | Chang et al. |
| 6,582,877 B2 | 6/2003 | Chang et al. |
| 6,720,126 B2 * | 4/2004 | Shimomura et al. ......... 430/200 |
| 6,866,979 B2 | 3/2005 | Chang et al. |

FOREIGN PATENT DOCUMENTS

| | | |
|---|---|---|
| EP | 568 993 | 11/1993 |
| EP | 0 641 008 | 1/1995 |
| GB | 2 083 726 | 3/1982 |
| JP | 146447 | 11/1980 |
| JP | 55-163500 | 12/1980 |
| JP | 57-147542 | 9/1982 |
| JP | 59-020486 | 2/1984 |
| JP | SHO 61-252501 | 11/1986 |
| JP | 62-67416 | 3/1987 |
| JP | 62-95670 | 5/1987 |
| JP | 63-060788 | 3/1988 |
| JP | 63-60793 | 3/1988 |
| JP | 63089385 | 4/1988 |
| JP | 63-297090 | 12/1988 |
| JP | 64-14081 | 1/1989 |
| JP | 63-02270 A | 7/1989 |
| JP | 2-162095 | 6/1990 |
| JP | 02-252580 | 10/1990 |
| JP | 04-216095 | 8/1992 |
| JP | HEI 1995-104113 | 4/1993 |
| JP | 05-286257 | 11/1993 |
| JP | 5-338358 | 12/1993 |
| JP | 06-115264 | 4/1994 |
| JP | 6-219052 | 8/1994 |
| JP | 7-104113 | 4/1995 |
| JP | 7-76093 | 10/1996 |
| JP | 08-267943 | 10/1996 |
| JP | HEI 8-267943 | 10/1996 |
| WO | WO 94/22674 | 10/1994 |
| WO | WO 95/13195 | 5/1995 |
| WO | WO 96/02010 | 1/1996 |

OTHER PUBLICATIONS

Matsuoka, M., Absorption Spectra of Dyes For Diode Lasers, Bunshin Publishing Co., Tokyo, 1990.

Matsuoka, M., Infrared Absorbing Materials, Plenum Press, New York, 1990.

Mitsuru, I., et al., "Thermal Transfer Color Printing Using Laser Heating", *Journal of Imaging Science and Technology*, vol. 37, May/Jun. 1993.

Oki, K., et al., "A Phosphor Screen for High-Resolution CRTs", *Journal of the SID*, vol. 3, No. 51 (1995).

Raue, R., et al., "Phosphor Screens in Cathode-Ray Tubes for Projection Television", *Philips Tech. Rev.*, vol. 44, No. 11/12, p. 335-347 (Nov. 1989).

Chang et al., "Laser Addressable Thermal Transfer Imaging Element with an Interlayer", U.S. Appl. No. 11/272,240, filed Nov. 10, 2005.

Surface Texture (Surface Roughness, Waviness, and Lay, ASME B46.1-1995 (Revision of ANSI/ASME B46.1-1985), 1996, pp. iii-x and 1-19.

Strobel et al, A Comparison of Corona-Treated and Flame-Treated Polypropylene Films, Plasmas and Polymers, vol. 8, No. 1, Mar. 2003, pp. 61-95.

Cohen et al., "Modern Coating and Drying Technology", pp. 132, 133, 289, 294 and 295 (1992).

* cited by examiner

TEXTURE CONTROL OF THIN FILM LAYERS PREPARED VIA LASER INDUCED THERMAL IMAGING

REFERENCE TO RELATED APPLICATIONS

This is a continuation-in-part of Ser. No. 11/022,963, filed Dec. 27, 2004 now abandoned, which is a continuation of Ser. No. 10/726,315, now U.S. Pat. No. 6,866,979, filed Dec. 1, 2003, which is a continuation of Ser. No. 10/440,689, filed May. 19, 2003, now abandoned, which is a continuation of Ser. No. 09/738,735, filed Dec. 15, 2000, now. U.S. Pat. No. 6,461,793, which is a continuation of Ser. No. 09/553,294, now U.S. Pat. No. 6,270,934, filed Apr. 20, 2000, which is a continuation of Ser. No. 09/349,329, now U.S. Pat. No. 6,099,994, filed Jul. 8, 1999, which is a continuation of Ser. No. 09/031,941, now U.S. Pat. No. 5,981,136, filed Feb. 27, 1998, which is a division of Ser. No. 08/632,225, now U.S. Pat. No. 5,725,989, filed Apr. 15, 1996, all of which are incorporated herein by reference as if fully set forth.

FIELD OF INVENTION

The present invention relates to thermal transfer imaging elements for use in a laser induced thermal imaging (LITI) or equivalent process. In particular, it relates to laser addressable thermal transfer elements having a radiation-absorbing/thermal conversion layer and a transferable layer having an at least partially controllable relative texture.

BACKGROUND

With the increase in electronic imaging information capacity and use, a need for imaging systems capable of being addressed by a variety of electronic sources is also increasing. Examples of such imaging systems include thermal transfer, ablation (or transparentization) and ablation-transfer imaging. These imaging systems have been shown to be useful in a wide variety of applications, such as, color proofing, color filter arrays for liquid crystal display devices, printing plates, and reproduction masks.

The traditional method of recording electronic information with a thermal transfer imaging medium utilizes a thermal printhead as the energy source. The information is transmitted as electrical energy to the printhead causing a localized heating of a thermal transfer donor sheet which then transfers material corresponding to the image data to a receptor sheet. The two primary types of thermal transfer donor sheets are dye sublimation (or dye diffusion transfer) and thermal mass transfer. Representative examples of these types of imaging systems can be found in U.S. Pat. Nos. 4,839,224 and 4,822,643. The use of thermal printheads as an energy source suffers several disadvantages, such as, size limitations of the printhead, slow image recording speeds (milliseconds), limited resolution, limited addressability, and artifacts on the image from detrimental contact of the media with the printhead.

The increasing availability and use of higher output compact lasers, semiconductor light sources, laser diodes and other radiation sources which emit in the ultraviolet, visible and particularly in the near-infrared and infrared regions of the electromagnetic spectrum, have allowed the use of these sources as viable alternatives for the thermal printhead as an energy source. The use of a radiation source such as a laser or laser diode as the imaging source is one of the primary and preferred means for transferring electronic information onto an image recording media. The use of radiation to expose the media provides higher resolution and more flexibility in format size of the final image than the traditional thermal printhead imaging systems. In addition, radiation sources such as lasers and laser diodes provide the advantage of eliminating the detrimental effects from contact of the media with the heat source. As a consequence, a need exists for media that have the ability to be efficiently exposed by these sources and have the ability to form images having high resolution and improved edge sharpness.

It is well known in the art to incorporate light-absorbing layers in thermal transfer constructions to act as light-to-heat converters, thus allowing non-contact imaging using radiation sources such as lasers and laser diodes as energy sources. Representative examples of these types of elements can be found in U.S. Pat. Nos. 5,308,737; 5,278,023; 5,256,506; and 5,156,938. The transfer layer may contain light absorbing materials such that the transfer layer itself functions as the light-to-heat conversion layer. Alternatively, the light-to-heat conversion layer may be a separate layer, for instance, a separate layer between the substrate and the transfer layer.

Constructions in which the transfer layer itself functions as the light-to-heat conversion layer may require the addition of an additive to increase the absorption of incident radiation and effect transfer to a receptor. In these cases, the presence of the absorber in the transferred image may have a detrimental effect upon the performance of the imaged object (e.g., visible absorption which reduces the optical purity of the colors in the transferred image, reduced transferred image stability, incompatibility between the absorber and other components present in the imaging layer, etc.).

Contamination of the transferred image by the light-to-heat conversion layer itself is often observed when using donor constructions having a separate light-to-heat conversion layer. In the cases where contamination of the transferred image by such unintended transfer of the light-to-heat conversion layer occurs and the light-to-heat conversion layer possesses an optical absorbance that interferes with the performance of the transferred image (e.g., transfer of a portion of a black body light-to-heat conversion layer to a color filter array or color proof), the incidental transfer of the light-to-heat conversion layer to the receptor is particularly detrimental to quality of the imaged article. Similarly, mechanical or thermal distortion of the light-to-heat conversion layer during imaging is common and negatively impacts the quality of the transferred coating.

U.S. Pat. No. 5,171,650 discloses methods and materials for thermal imaging using an "ablation-transfer" technique. The donor element used in the imaging process comprises a support, an intermediate dynamic release layer, and an ablative carrier topcoat containing a colorant. Both the dynamic release layer and the color carrier layer may contain an infrared-absorbing (light to heat conversion) dye or pigment. A colored image is produced by placing the donor element in intimate contact with a receptor and then irradiating the donor with a coherent light source in an imagewise pattern. The colored carrier layer is simultaneously released and propelled away from the dynamic release layer in the light struck areas creating a colored image on the receptor.

Co-pending U.S. application Ser. No. 07/855,799 filed Mar. 23, 1992 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., black aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen (N2) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

Laser-induced mass transfer processes have the advantage of very short heating times (nanoseconds to microseconds); whereas, the conventional thermal mass transfer methods are relatively slow due to the longer dwell times (milliseconds) required to heat the printhead and transfer the heat to the donor. The transferred images generated under laser-induced ablation imaging conditions are often fragmented (being propelled from the surface as particulates or fragments). The images from thermal melt stick transfer systems tend to show deformities on the surface of the transferred material. Therefore, there is a need for a thermal transfer system that takes advantage of the speed and efficiency of laser addressable systems without sacrificing image quality or resolution.

SUMMARY OF INVENTION

A thermal transfer element, consistent with the present invention, includes a substrate, thermal transfer layer, and light-to-heat conversion layer disposed between the substrate and the thermal transfer layer. The LTHC may be optional if at least one of the substrate and transfer layer is absorbing of the imaging radiation. A surface texture of the thermal transfer layer is at least partially controlled prior to imaging of the transfer element.

A process for transferring an image onto a receptor, consistent with the present invention, includes the steps of providing on a substrate a light-to-heat conversion layer and a thermal transfer layer coated on the light-to-heat conversion layer, and placing the thermal transfer layer in contact with a surface of the receptor. The light-to-heat conversion layer is irradiated in an imagewise pattern with a light source to thermally transfer portions of the thermal transfer layer corresponding to the imagewise pattern to the receptor. In the process, a surface texture of the transferred thermal transfer layer is at least partially controlled prior to the placing step and prior to imaging of the transfer layer.

At least partially controlling the surface texture, in the element and process, can involve use of various treatments and materials. For example, it can involve controlling the surface texture and/or surface waviness of the layer (for example, interlayer or LTHC or substrate) contacting the transfer layer or transfer layer stack in the case of a multilayer transfer layer) using a particular thickness for the transfer layer, or other techniques. Controlling the surface texture, at least partially, can provide for various affects in a resulting device made with the thermal transfer element.

As used herein, the following terms and phrases have the following meaning.

The phrase "in intimate contact" refers to sufficient contact between two surfaces such that the transfer of materials may be accomplished during the imaging process to provide a sufficient transfer of material within the thermally addressed areas. In other words, no voids are present in the imaged areas which would render the transferred image non-functional in its intended application.

The definitions of surface texture and its constituents (including roughness, waviness and lay) and the corresponding parameters for specifying surface texture and its constituents are those described in ASME B46.1-1995, *Surface Texture (Surface Roughness, Waviness and Lay)*, incorporated herein by reference as if fully set forth.

Other aspects, advantages, and benefits of embodiments of the present invention are apparent from the detailed description, the examples, and the claims.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
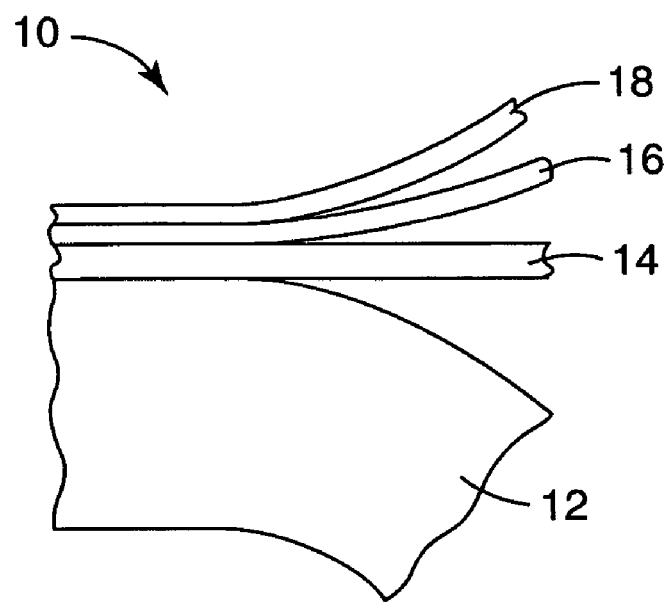
FIG. 1 is a diagram illustrating an example of LITI donor film.

A thermal transfer element is provided comprising a light transparent substrate having deposited thereon, in the following order, a light-to-heat conversion (LTHC) layer, a heat stable interlayer, and a thermal transfer layer. The substrate is typically a polyester film, for example, poly(ethylene terephthalate) or poly(ethylene naphthalate). However, any film that has appropriate optical properties and sufficient mechanical stability can be used.

Light-to-Heat Conversion Layer

In order to couple the energy of the exposure source into the imaging construction it is especially desirable to incorporate a light-to-heat conversion (LTHC) layer within the construction. The LTHC layer comprises a material which absorbs at least at the wavelength of irradiation and converts a portion of the incident radiation into sufficient heat to enable transfer the thermal transfer layer from the donor to the receptor. Typically, LTHC layers will be absorptive in the infrared region of the electromagnetic spectrum, but in some instances visible or ultraviolet absorptions may be selected. It is generally desirable for the radiation absorber to be highly absorptive of the imaging radiation, enabling an optical density at the wavelength of the imaging radiation in the range of 0.2 to 3.0 using a minimum amount of radiation absorber to be used.

Dyes suitable for use as radiation absorbers in a LTHC layer may be present in particulate form or preferably substantially in molecular dispersion. Especially preferred are dyes absorbing in the IR region of the spectrum. Examples of such dyes may be found in Matsuoka, M., Infrared Absorbing Materials, Plenum Press, New York, 1990, and in Matsuoka, M., Absorption Spectra of Dyes for Diode Lasers, Bunshin Publishing Co., Tokyo, 1990. IR absorbers marketed by American Cyanamid or Glendale Protective Technologies, Inc., Lakeland, Fla., under the designation CYASORB IR-99, IR-126 and IR-165 may also be used. Such dyes will be chosen for solubility in, and compatibility with, the specific polymer and coating solvent in question.

Pigmentary materials may also be dispersed in the LTHC layer for use as radiation absorbers. Examples include carbon black and graphite as well as phthalocyanines, nickel dithiolenes, and other pigments described in U.S. Pat. Nos. 5,166, 024 and 5,351,617. Additionally, black azo pigments based on copper or chromium complexes of, for example, pyrazolone yellow, dianisidine red, and nickel azo yellow are useful. Inorganic pigments are also valuable. Examples include oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead or tellurium. Metal borides, carbides, nitrides, carbonitrides, bronze-structured oxides, and oxides structurally related to the bronze family (e.g. WO2.9) are also of utility.

When dispersed particulate radiation absorbers are used, it is preferred that the particle size be less than about 10 micrometers, and especially preferred that the particle size be less than about 1 micrometer. Metals themselves may be employed, either in the form of particles, as described for instance in U.S. Pat. No. 4,252,671, or as films as disclosed in U.S. Pat. No. 5,256,506. Suitable metals include aluminum, bismuth, tin, indium, tellurium and zinc.

Suitable binders for use in the LTHC layer include film-forming polymers, such as for example, phenolic resins (i.e., novolak and resole resins), polyvinyl butyral resins, polyvinylacetates, polyvinyl acetals, polyvinylidene chlorides, polyacrylates, cellulosic ethers and esters, nitrocelluloses, and polycarbonates. The absorber-to-binder ratio is generally from 5:1 to 1:100 by weight depending on what type of absorbers and binders are used. Conventional coating aids, such as surfactants and dispersing agents, may be added to facilitate the coating process. The LTHC layer may be coated onto the substrate using a variety of coating methods known in the art. The LTHC layer is coated to a thickness of 0.001 to 20.0 micrometers, preferably 0.01 to 5.0 micrometers. The desired thickness of the LTHC layer will depend upon the composition of the layer.

A preferred LTHC layer is a pigment/binder layer. A particularly preferred pigment based LTHC layer is carbon black dispersed in an organic polymeric binder. Alternatively, other preferred LTHC layers include metal or metal/metal oxide layers (e.g. black aluminum which is a partially oxidized aluminum having a black visual appearance).

Interlayer Construction

The interlayer may comprise an organic and/or inorganic material. In order to minimize damage and contamination of the resultant transferred image, the interlayer should have high thermal resistance. Preferably, the layer should not visibly distort or chemically decompose at temperatures below 150° C. These properties may be readily provided by polymeric film (thermoplastic or thermoset layers), metal layers (e.g., vapor deposited metal layers), inorganic layers (e.g., sol-gel deposited layers, vapor deposited layers of inorganic oxides [e.g., silica, titania, etc., including metal oxides]), and organic/inorganic composite layers (thermoplastic or thermoset layers). Organic materials suitable as interlayer materials include both thermoset (crosslinked) and thermoplastic materials. In both cases, the material chosen for the interlayer should be film forming and should remain substantially intact during the imaging process. This can be accomplished by the proper selection of materials based on their thermal and/or mechanical properties. As a guideline, the Tg of the thermoplastic materials should be greater than 150° C., more preferably greater than 180° C. The interlayer may be either transmissive, absorbing, reflective, or some combination thereof at the imaging radiation wavelength.

The surface characteristics of the interlayer will depend on the application for which the imaged article is to be used. Frequently, it will be desirable to have an interlayer with a "smooth" surface so as not to impart adverse texture to the surface of the thermally transferred layer. This is especially important for applications requiring rigid dimensional tolerances such as for color filter elements for liquid crystal displays. However, for other applications surface "roughness" or "surface patterns" may be tolerable or even desirable.

The interlayer provides a number of desirable benefits. The interlayer is essentially a barrier against the transfer of material from the light-to-heat conversion layer. The interlayer can also prevent distortion of the transferred thermal transfer layer material. It may also modulate the temperature attained in the thermal transfer layer so that more thermally unstable materials can be transferred and may also result in improved plastic memory in the transferred material. It is also to be noted that the interlayer of the present invention, when placed over the LTHC layer, is incompatible with propulsively ablative systems like those of U.S. Pat. Nos. 5,156,938; 5,171, 650; and 5,256,506 because the interlayer would act as a barrier to prevent propulsive forces from the LTHC layer from acting on the thermal transfer layer. The gas-generating layers disclosed in those patents also would not qualify as interlayers according to the present invention, as those layers must be thermally unstable at the imaging temperatures to decompose and generate the gas to propel material from the surface.

Suitable thermoset resins include materials which may be crosslinked by thermal, radiation, or chemical treatment including, but not limited to, crosslinked poly(meth)acrylates, polyesters, epoxies, polyurethanes, etc. For ease of application, the thermoset materials are usually coated onto the light-to-heat conversion layer as thermoplastic precursors and subsequently crosslinked to form the desired crosslinked interlayer.

In the case of thermoplastic materials, any material which meets the above-mentioned functional criteria may be employed as an interlayer material. Accordingly, the preferred materials will possess chemical stability and mechanical integrity under the imaging conditions. Classes of preferred thermoplastic materials include polysulfones, polyesters, polyimides, etc. These thermoplastic organic materials may be applied to the light-to-heat conversion layer via conventional coating techniques (solvent coating, etc.).

In the cases of interlayers comprised of organic materials, the interlayers may also contain appropriate additives including photoinitiators, surfactants, pigments, plasticizers, coating aids, etc. The optimum thickness of an organic interlayer is material dependent and, in general, will be the minimum thickness at which transfer of the light-to-heat conversion layer and distortion of the transferred layer are reduced to levels acceptable for the intended application (which will generally be between 0.05 microns and 10 microns).

Inorganic materials suitable as interlayer materials include metals, metal oxides, metal sulfides, inorganic carbon coatings, etc., including those which are highly transmissive or reflective at the imaging laser wavelength. These materials may be applied to the light-to-heat-conversion layer via conventional techniques (e.g., vacuum sputtering, vacuum evaporation, plasma jet, etc.). The optimum thickness of an inorganic interlayer will again be material dependent. The optimum thickness will be, in general, the minimum thickness at which transfer of the light-to-heat conversion layer and distortion of the transferred layer are reduced to an acceptable level (which will generally be between 0.01 microns and 10 microns).

In the case of reflective interlayers, the interlayer comprises a highly reflective material, such as aluminum or coatings of $TiO_2$ based inks. The reflective material should be capable of forming an image-releasing surface for the overlying colorant layer and should remain intact during the colorant coating process. The interlayer should not melt or transfer under imaging conditions. In the case where imaging is performed via irradiation from the donor side, a reflective interlayer will attenuate the level of imaging radiation transmitted through the interlayer and thereby reduce any damage to the resultant image that might result from interaction of the transmitted radiation with the transfer layer and/or receptor. This is particularly beneficial in reducing thermal damage to the transferred image which might occur when the receptor is highly absorptive of the imaging radiation. Optionally, the thermal transfer donor element may comprise several interlayers, for example, both a reflective and transmissive interlayer, the sequencing of which would be dependent upon the imaging and end-use application requirements.

Suitable highly reflective metallic films include aluminum, chrome, and silver. Suitable pigment based inks include standard white pigments such as titanium dioxide, calcium carbonate, and barium sulfate used in conjunction with a binder. The binder may be either a thermoplastic or thermoset material. Preferred binders include high Tg resins such as polysulfones, polyarylsulfones, polyarylethersulfones, polyetherimides, polyarylates, polyimides, polyetheretherketones, and polyamideimides (thermoplastics) and polyesters, epoxies, polyacrylates, polyurethanes, phenol-formaldehydes, urea-formaldehydes, and melamine-formaldehydes (thermosets), etc.

Polymerizable or crosslinkable monomers, oligomers, prepolymers and polymers may be used as binders and crosslinked to form the desired heat-resistant, reflective interlayer after the coating process. The monomers, oligomers, prepolymers and polymers that are suitable for this application include known chemicals that can form a heat resistant polymeric layer. The layer may also contain additives such as crosslinkers, surfactants, coating aids, and pigments.

The reflective layer thickness can be optimized with respect to imaging performance, sensitivity, and surface smoothness. Normally the thickness of the interlayer is 0.005 to 5 microns, preferably between 0.01 to 2.0 microns. Optionally, the reflective interlayer may be overcoated with a non-pigmented polymeric interlayer to allow a better release of color image.

Thermal Transfer Layer

The transfer layer is formulated to be appropriate for the corresponding imaging application (e.g., color proofing, printing plate, color filters, etc.). The transfer layer may itself be comprised of thermoplastic and/or thermoset materials. In many product applications (for example, in printing plate and color filter applications) the transfer layer materials are preferably crosslinked after laser transfer in order to improve performance of the imaged article. Additives included in the transfer layer will again be specific to the end-use application (e.g., colorants for color proofing and color filter applications, photoinitiators for photo-crosslinked or photo-crosslinkable transfer layers, etc.,) and are well known to those skilled in the art.

Because the interlayer can modulate the temperature attained in the thermal transfer layer, materials which tend to be more sensitive to heat than typical pigments may be transferred with reduced damage using the process of the present invention. For example, medical diagnostic chemistry can be included in a binder and transferred to a medical test card using the present invention with less likelihood of damage to the medical chemistry and less possibility of corruption of the test results. A chemical or enzymatic indicator would be less likely to be damaged using the present invention with an interlayer compared to the same material transferred from a conventional thermal donor element.

The thermal transfer layer may comprise classes of materials including, but not limited to dyes (e.g., visible dyes, ultraviolet dyes, fluorescent dyes, radiation-polarizing dyes, IR dyes, etc.), optically active materials, pigments (e.g., transparent pigments, colored pigments, black body absorbers, etc.), magnetic particles, electrically conducting or insulating particles, liquid crystal materials, hydrophilic or hydrophobic materials, initiators, sensitizers, phosphors, polymeric binders, enzymes, etc.

For many applications such as color proofing and color filter elements, the thermal transfer layer will comprise colorants. Preferably the thermal transfer layer will comprise at least one organic or inorganic colorant (i.e., pigments or dyes) and a thermoplastic binder. Other additives may also be included such as an IR absorber, dispersing agents, surfactants, stabilizers, plasticizers, crosslinking agents and coating aids. Any pigment may be used, but for applications such as color filter elements, preferred pigments are those listed as having good color permanency and transparency in the NPIRI Raw Materials Data Handbook, Volume 4 (Pigments) or W. Herbst, Industrial Organic Pigments, VCH, 1993. Either non-aqueous or aqueous pigment dispersions may be used. The pigments are generally introduced into the color formulation in the form of a millbase comprising the pigment dispersed with a binder and suspended into a solvent or mixture of solvents. The pigment type and color are chosen such that the color coating is matched to a preset color target or specification set by the industry. The type of dispersing resin and the pigment-to-resin ratio will depend upon the pigment type, surface treatment on the pigment, dispersing solvent and milling process used in generating the millbase. Suitable dispersing resins include vinyl chloride/vinyl acetate copolymers, poly(vinyl acetate)/crotonic acid copolymers, polyurethanes, styrene maleic anhydride half ester resins, (meth)acrylate polymers and copolymers, poly(vinyl acetals), poly(vinyl acetals) modified with anhydrides and amines, hydroxy alkyl cellulose resins and styrene acrylic resins. A preferred color transfer coating composition comprises 30-80% by weight pigment, 15-60% by weight resin, and 0-20% by weight dispersing agents and additives.

The amount of binder present in the color transfer layer is kept to a minimum to avoid loss of image resolution and/or imaging sensitivity due to excessive cohesion in the color transfer layer. The pigment-to-binder ratio is typically between 10:1 to 1:10 by weight depending on the type of pigments and binders used. The binder system may also include polymerizable and/or crosslinkable materials (i.e., monomers, oligomers, prepolymers, and/or polymers) and optionally an initiator system. Using monomers or oligomers assists in reducing the binder cohesive force in the color transfer layer, therefore improving imaging sensitivity and/or transferred image resolution. Incorporation of a crosslinkable composition into the color transfer layer allows one to produce a more durable and solvent resistant image. A highly crosslinked image is formed by first transferring the image to a receptor and then exposing the transferred image to radiation, heat and/or a chemical curative to crosslink the polymerizable materials. In the case where radiation is employed to crosslink the composition, any radiation source can be used that is absorbed by the transferred image. Preferably the composition comprises a composition which may be crosslinked with an ultraviolet radiation source.

The color transfer layer may be coated by any conventional coating method known in the art. It may be desirable to add coating aids such as surfactants and dispersing agents to provide an uniform coating. Preferably, the layer has a thickness from about 0.05 to 10.0 micrometers, more preferably from 0.5 to 2.0 micrometers.

Receiver

The image receiving substrate may be any substrate suitable for the application including, but not limited to, various papers, transparent films, LCD black matrices, active portions of LCD displays, metals, etc. Suitable receptors are well known to those skilled in the art. Non-limiting examples of receptors which can be used in the present invention include anodized aluminum and other metals, transparent plastic films (e.g., PET), glass, and a variety of different types of paper (e.g., filled or unfilled, calendered, coated, etc.). Various layers (e.g., an adhesive layer) may be coated onto the image receiving substrate to facilitate transfer of the transfer layer to the receiver.

Imaging Process

The process of the present invention may be performed by fairly simple steps. During imaging, the donor sheet is brought into intimate contact with a receptor sheet under pressure or vacuum. A radiation source is then used to heat the LTHC layer in an imagewise fashion (e.g., digitally, analog exposure through a mask, etc.) or to perform imagewise transfer of the thermal transfer layer from the donor to the receptor.

The interlayer reduces the transfer of the LTHC layer to the receptor and/or reduces distortion in the transferred layer. Without this interlayer in thermal mass transfer processes addressed by radiation sources, the topography of the transfer surface from the light-to-heat conversion layer may be observably altered. A significant topography of deformations and wrinkles may be formed. This topography may be imprinted on the transferred donor material. This imprinting of the image alters the reflectivity of the transferred image (rendering it less reflective than intended) and can cause other undesirable visual effects. It is preferred that under imaging conditions, the adhesion of the interlayer to the LTHC layer be greater than the adhesion of the interlayer to the thermal transfer layer. In the case where imaging is performed via irradiation from the donor side, a reflective interlayer will attenuate the level of imaging radiation transmitted through the interlayer and thereby reduce any transferred image damage that may result from interaction of the transmitted radiation with the transfer layer and/or the receptor. This is particularly beneficial in reducing thermal damage which may occur to the transferred image when the receptor is highly absorptive of the imaging radiation.

A variety of light-emitting sources can be utilized in the present invention. Infrared, visible, and ultraviolet lasers are particularly useful when using digital imaging techniques. When analog techniques are used (e.g., exposure through a mask) high powered light sources (e.g, xenon flash lamps, etc.) are also useful. Preferred lasers for use in this invention include high power (>100 mW) single mode laser diodes, fiber-coupled laser diodes, and diode-pumped solid state lasers (e.g., Nd:YAG and Nd:YLF). Laser exposure dwell times should be from about 0.1 to 5 microseconds and laser fluences should be from about 0.01 to about 1 Joules/cm2.

During laser exposure, it may be desirable to minimize formation of interference patterns due to multiple reflections from the imaged material. This can be accomplished by various methods. The most common method is to effectively roughen the surface of the donor material on the scale of the incident radiation as described in U.S. Pat. No. 5,089,372. This has the effect of disrupting the spatial coherence of the incident radiation, thus minimizing self interference. An alternate method is to employ the use of an antireflection coating on the second interface that the incident illumination encounters. The use of anti-reflection coatings is well known in the art, and may consist of quarter-wave thicknesses of a coating such as magnesium fluoride, as described in U.S. Pat No. 5,171,650. Due to cost and manufacturing constraints, the surface roughening approach is preferred in many applications.

Control of Layer Texture

A key component of the LITI process is the donor film, which generally comprises a base substrate, an optional LTHC layer and an optional interlayer. Examples of those layers, and materials and constructions of them, are described above and shown in FIG. 1. In an exemplary donor film, a thermal transfer element 10 is provided comprising a light transparent substrate 12 having deposited thereon, in the following order, an optional light-to-heat conversion (LTHC) layer 14, an optional interlayer (IL) 16, and a thermal transfer layer 18. The substrate 12 is typically a polyester film, for example, poly(ethylene terephthalate) or poly(ethylene naphthalate).

Figure 2:
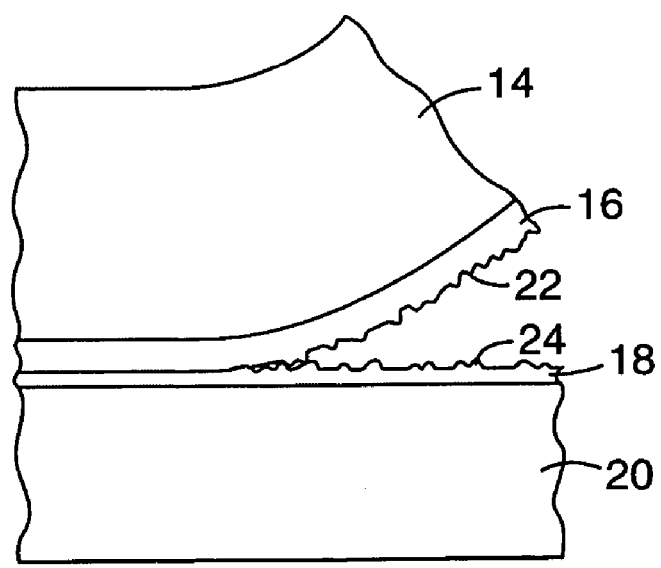
FIG. 2 is a diagram illustrating transfer of texture in a thermal transfer layer during a LITI process.

LITI can be useful in patterning one or more layers of materials in order to construct organic light emitting display (OLED) devices or other organic devices. In the case of LITI donor media for patterning OLED devices, the transfer layers are generally quite thin, typically 20 nanometers (nm) to 100 nm. The LITI patterning step is often used to pattern a unique color-emissive layer, such as red, blue, or green sub-pixels in the resulting display module. In patterning thin layers, the surface roughness, waviness and/or lay of the donor film can have an impact on the resultant corresponding properties of the transfer layer. As an example, imprinting of surface texture from the donor can be seen in the transfer layer after patterning. FIG. 2 illustrates how surface texture 22 in the interlayer 16 (release layer) may be substantially replicated in the surface 24 of the transferred image (transfer layer 18) on the receptor 20.

In display structures, continuous, smooth layers may be desirable, or even essential, to the end use performance of the display. The patterning step can introduce a number of defects which may compromise continuity or smoothness. In patterning the emissive layer in an OLED device, discontinuous material or texture in the surface layers may significantly reduce device performance. In devices where dyed or pigmented layers are used to filter light, differences in hue or other optical properties are possible by thickness variation or distortion.

In OLED devices, various defects in the transfer layer can result in lower performance, particularly current-to-light conversion efficiency or decreased device lifetimes. For the case of patterning the emissive (transfer) layer, defects may have a significant impact on performance. If the emissive layer is discontinuous, charges will be capable of bypassing this layer, resulting in possible electrical shorting or recombination within a surrounding layer. This situation can result in light emission of an undesired color or a lower efficiency. For the case of patterning a layer with high texture, that layer may impart texture in subsequently patterned layers due to the conformal nature of vacuum coated layers. This can cause interfacial issues with thin patterned layers (e.g., Lithium fluoride which is typically deposited at less than 10 Å) or layers with high-energy barriers for charge injection. For the case of a continuous smooth interface, optimal charge recombination can result, giving the highest electroluminescent internal efficiency for a given stack configuration. Accordingly, at least partially controlling surface texture in the donor can be useful in many embodiments.

Figure 3:
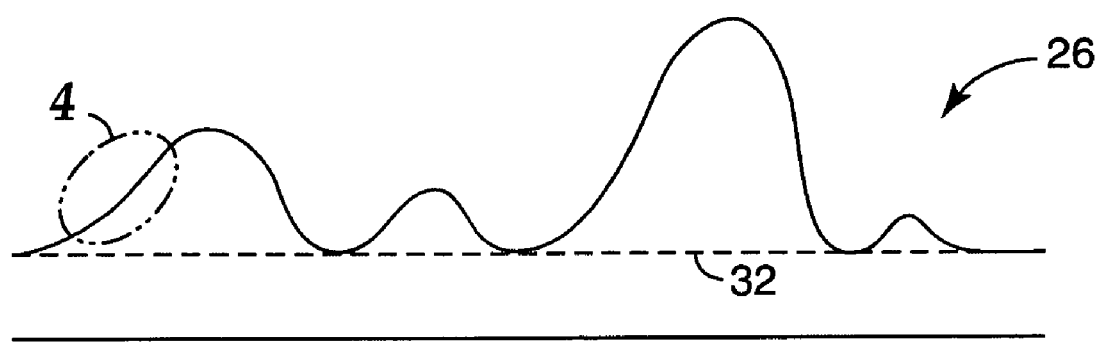
FIG. 3 is a diagram illustrating waviness on a transfer element for use with a LITI process.
Figure 4:
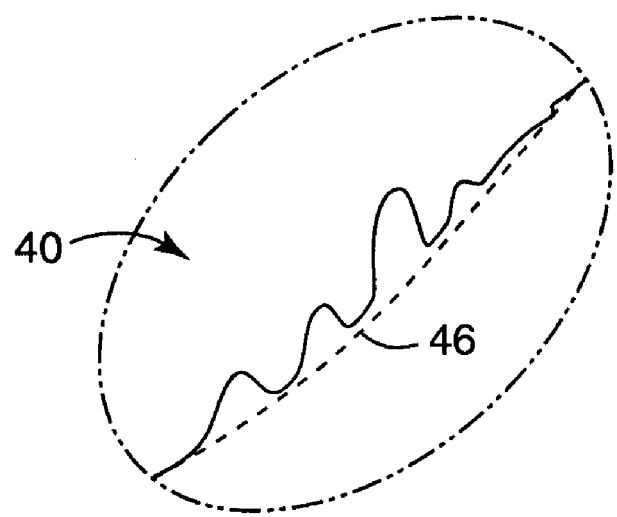
FIG. 4 is a diagram illustrating roughness of waviness on a transfer element for use with a LITI process.

Surface texture includes waviness, roughness, and lay. FIG. 3 is a diagram illustrating waviness on a transfer element for use with a LITI process. Waviness typically includes non-planar features, as illustrated by peaks 26 having varying heights above a virtual surface plane 32 of the transfer element. Roughness can be considered as non-planar features on the waviness such as a portion 40 of features 26, as shown in the exploded diagram of FIG. 4. (As shown in FIG. 4, roughness can include non-planar features on a virtual slope 46 of a waviness feature.)

The definitions of surface texture and its constituents (roughness, waviness and lay) and the corresponding parameters for specifying surface texture are those described in ASME B46.1-1995, *Surface Texture (Surface Roughness, Waviness and Lay)*. As shown in the Examples below, the roughness average, Ra, can be calculated for a given area of the donor and compared against other average roughness values or a particular known value.

Embodiments of the present invention include techniques performed on the donor film or related to donor film construction, prior to imaging of the donor, in order to affect or at least partially control a surface texture of the transfer layer after having been transferred to the receptor. Examples of those techniques and donor film constructions are provided below and can be used to at least partially control roughness, waviness, lay, or a combination thereof in the donor film prior to imaging. In certain embodiments it may be desirable to at least partially control waviness without regard to roughness or vice versa. In other embodiments, it may be desirable to at least partially control both. The actual roughness may depend upon multiple factors, not all of which are necessarily controllable. Thus, certain embodiments involve at least partially controlling roughness such that the resulting texture, or smoothness, is at least within a particular range. For certain embodiments, it is desirable to control the roughness of the donor (without the transfer layer) in relation to the thickness of the transfer layer. In particular, for particular embodiments it is preferred to have the surface roughness of the donor (without the transfer layer) be less than 10%, 5%, 2%, or 1% of the total thickness of the transfer layer.

Partial control of texture (roughness, waviness and/or lay) can involve any of the layers in the donor, prior to imaging, or even any additional layers used with the donor. Typically, the surface roughness, waviness and/or lay of the transfer layer or optional interlayer is at least partially controlled prior to imaging. For 5×5 micron area as determined with AFM, a roughness less than 1 nm ARq is preferred, more preferably less than 0.8 nm, and most preferred less than 0.5 nm. However, a roughness, waviness and/or lay of the LTHC or substrate can also be at least partially controlled during construction of the donor. For 5×5 micron area as determined with AFM, a roughness of the base substrate of less than 31 nm ARq is preferred, more preferably less than 10 nm ARq, and most preferred less than 5.0 nm ARq. For 5×5 micron area as determined with AFM, a roughness of the LTHC of less than 40 nm ARq is preferred, more preferably less than 10 nm ARq, and most preferred less than 1 nm ARq. The various exemplary techniques to at least partially control roughness, waviness and/or lay can be evaluated, based on empirical evidence for example, to determine their effects waviness, roughness, or a combination thereof in the patterned transfer layer. Depending upon a desired roughness and/or waviness, a technique or combination of techniques can be selected and performed on the donor prior to imaging in order to achieve the desired result.

In a preferred embodiment, a LITI donor comprising a substrate and optional LTHC layer and an optional interlayer is prepared in which the roughness for at least one of the substrate, optional LTHC or optional interlayer is controlled such that for 5×5 micron area as determined with AFM, a roughness less than 1 nm ARq is preferred, more preferably less than 0.8 nm, and most preferred less than 0.5 nm.

In a preferred embodiment, a LITI donor comprising a substrate, LTHC layer and an interlayer is coated in which the roughness of the interlayer is controlled such that for 5×5 micron area as determined with AFM, a roughness less than 1 nm ARq is preferred, more preferably less than 0.8 nm, and most preferred less than 0.5 nm.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a flat panel display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an OLED display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an LCD display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a color filter for an OLED display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a color filter for an LCD display.

In a preferred embodiment, a LITI donor comprising a substrate, LTHC layer and at least a partially thermoplastic interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an organic electronic device.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a flat panel display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an OLED display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an LCD display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a color filter for an OLED display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into a color filter for an LCD display.

In a preferred embodiment, a LITI donor comprising a substrate, LTHC layer and at least a partially crosslinked interlayer is coated in which the roughness of the interlayer is controlled such that for 5×5 micron area as determined with AFM, a roughness less than 1 nm ARq is preferred, more preferably less than 0.8 nm, and most preferred less than 0.5 nm. The donor is subsequently coated with a transfer layer comprising a material suitable for incorporating into an organic electronic device.

Texture can be modified by controlling the size and distribution of particles in one or more of the layers in the donor prior to imaging. For example, carbon black particles are inherently small (typically 10 nm-60 nm in diameter) but the particles may aggregate into larger features which may change the texture of the surface. Thus the surface texture of particle containing layers may be optimized based upon at least one of particle composition, particle size distribution, particle dispersion and particle dispersion filtration.

One technique for at least partially controlling roughness or texture involves selecting a particular thickness of the transfer layer as applied to the donor prior to the patterning step. A thicker transfer layer can result in a smoother (less rough) transfer layer on the receptor after the patterning step by effectively "filling in" the valleys on the receptor. However, if the transfer layer is too thick it may not adequately transfer in the LITI process or fulfill the functional requirements in its end use. Therefore, a particular thickness or range of thickness can be used to result in a less rough transfer layer after patterning, as may be determined through empirical evidence for example. The thickness of other layers in the donor can also be varied, prior to imaging, to achieve at least partial control of roughness in the transfer layer after patterning. Thus, another embodiment involves selecting a particular donor construction, prior to imaging of the donor, in order to at least partially control surface texture of the transfer layer after having been transferred to the receptor.

Surface texture of the transfer layer may also be controlled by controlling at least one of the coatings underlying the transfer layer and/or the transfer layer itself via the coating method used for the underlying and/or transfer layer coating.

For example, in one embodiment the surface texture of the transfer layer is controlled using an application head to apply the LTHC and interlayer coatings wherein the LTHC liquid media and the interlayer liquid media are applied simultaneously onto a length of material (for example the donor PET substrate) which is movable relative to the application head. The preferred application head comprises a dual slot extrusion type die, an extrusion slot/slide combination, or other methods known to those skilled in the art of applying two or more layers of fluid simultaneously. In these cases where the LTHC and interlayer are simultaneously coated and radiation curing of one or more of these coatings is desired, the curing of these coatings may be performed subsequent to the simultaneous coating. In another embodiment, the texture of the transfer layer is controlled via controlling at least one of the coatings underlying the transfer layer and/or the transfer layer itself via controlling the texture of the surface of the coating apparatus (die surface, gravure roll surface, etc.) employed to coat the corresponding underlying and/or transfer coating.

Yet another technique involves selection of particular materials for the interlayer, when used. The surface texture of the optional interlayer may be controlled, prior to imaging, by adjustment of the corresponding coatings composition, morphology, phase separation, coating conditions, drying conditions, etc. Also, using multiple interlayers, possibly constructed from the same or different materials, can also at least partially affect the roughness of the transfer layer. In addition, the environment in which the donor is constructed can at least partially affect a resulting roughness of the transfer layer when applied to the donor and subsequently patterned on a receptor. Therefore, a controlled environment to construct the donor prior to imaging can be used to at least partially affect surface roughness of the transfer layer, as also explained in the Examples. Thus, another embodiment involves selecting particular materials for the donor or an environment in which it is constructed, prior to imaging of the donor, in order to at least partially control surface texture of the transfer layer after having been transferred to the receptor.

Another technique to control surface texture in a donor coating is calendaring. For this technique, the corresponding one or more of the coatings/layers is contacted with an external surface to impart the desired texture with optional application of heat and/or pressure prior to imaging. The texture imparted to the LITI donor coating may be controlled by the surface texture of the external surface contacting the donor and the selection of the optional heating and/or pressure process conditions. Thus, another embodiment involves applying a calendaring treatment to the donor, prior to imaging of the donor, in order to at least partially control surface texture of the transfer layer after having been transferred to the receptor.

In certain embodiments, it can be useful to control static charging. In particular, the inclusion of a conductive material may reduce the tendency of the layer or subsequently coated layers from static charging, which is detrimental to the ability to overcoat as well as tending to attract particles which when incorporated within or on top of the donor may cause transfer defects. In addition, during the peel-off process after radiation exposure is complete, non-conductive donors may dissipate charge into the receptor, potentially damaging the backplane. For example, an active matrix thin film transistorized substrate could be damaged by charges dissipating from the donor. The conductive material may be a radiation absorber, such as conductive carbon black, or simply a conductive material which adds into the system. Examples include quaternary amines, conductive nanoparticles such as gold or silver, antimony or tin oxide based materials, or vanadium oxides. Alternatively, an antistatic coating may be applied within the donor construction to impart improved conductivity. Typical coatings used are based on PEDOT™ polythiophene/polystyrene sulfonic acid based materials, polyaniline, or polypyrrole type formulations. To reduce induced coating defects from particulate contamination, the underlying layer (or one or more of the layers, including the base substrate) preferably has a surface resistivity of $10^{12}$ ohms/square or less and a static decay time of less than 2 seconds.

It can be desirable to at least partially control the roughness to impart high performance OLEDs or color filter based devices, for example. Roughness control may be necessary or desired for a number of reasons. For example, certain embodiments include a donor with some roughness, prior to imaging, to allow for minimal "blocking" of the donor in roll or stacked sheet form (unintended transfer of a coating on one side of the substrate to the opposite side of the substrate), or to prevent unintended transfer of the transfer layer to the receptor in the non-exposed regions. The degree of acceptable imprinting effect may be related to the thickness of the transfer layer itself. In particular preferred embodiments the degree of imprinting is controlled, either by selection, or processing to be less than 10%, 5%, 2%, or 1% of the total thickness of the transfer layer.

In the course of developing a donor film with a smooth surface layer, roughness within the donor may be desirable in other embodiments. For example, the top layer may be desired to be a specific material which when normally applied to a smooth surface results in a rough layer. For example, highly crystalline materials like silver tend to form macrocrystalline regions when vacuum deposited onto a smooth surface. To reduce the roughness of the highly crystalline material, depositing a layer which provides some degree of roughness to the underlying layer serves to act as nucleating sites for the highly crystalline material. Deposition onto the roughened surface prevents silver atoms from migrating and forming larger crystallites, resulting in a finer textured surface. In addition to or as an alternative to treating the top surface, controlling a texture or roughness of the back surface of the substrate, prior to imaging, can also help control roughness of other layers.

The substrate includes a front surface on which the optional LTHC and other optional layers may be coated. The substrate back surface is the surface opposite that front surface and is the side. The donor film can be wound in roll form as a convenient way to store and ship the film; however, when the donor film is rolled up, the back surface of the substrate can emboss other layers due to the pressure of the substrate back surface against other layers in the roll. The roughness of the substrate back surface can be controlled by a variety of techniques such as coating it with a transparent material to impart smoothness, controlling the types and size distribution of any particulate fillers included in the substrate or overlying coatings, etc. Preferably, the roughness distribution of the substrate back surface is the same or less than the roughness distribution of the substrate front surface, using an average roughness measurement, to avoid adverse effects of embossing when the donor is rolled up or stacked. In a preferred embodiment the roughness of the back surface of the substrate is the same or less than the roughness distribution of the donor surface contacting the transfer layer prior to transfer, using an average roughness measurement, to avoid adverse effects of embossing when the donor is rolled up or stacked. One way to control changes in the top layer texture is to use a liner which would insulate the coating from the web backside. Other ways include applying a smoothing coating to the backside of the donor or sheeting the donor film without rolling up the donor film. Other methods via which the surface texture of the donor substrate might be controlled include control of the texture of the surface on which the substrate is formed (for example, cast, extruded, etc.), the process conditions (for example, drying conditions, orientation conditions, etc.) employed to form the substrate, the types and size distribution of any particulate fillers included in the substrate or overlying coatings, calendaring, embossing, surface treatments, etc.

In a preferred embodiment, the roughness of the donor's substrate's surface opposite the transfer layer is controlled, either by selection, or processing such that for 5×5 micron area as determined with AFM, a roughness of the base substrate of less than 31 nm ARq is preferred, more preferably less than 10 nm ARq, and most preferred less than 5.0 nm ARq. In other particular preferred embodiments the surface roughness of the substrate opposite the transfer layer is controlled, either by selection, or processing to be less than 10%, 5%, 2%, or 1% of the total thickness of the transfer layer. In another preferred embodiment, the roughness of the donor's substrate's surface opposite the transfer layer is controlled, either by selection, or processing such that for 5×5 micron area as determined with AFM, a roughness of the base substrate of less than 1 nm ARq is preferred, more preferably less than 0.8 nm ARq, and most preferred less than 0.5 nm ARq.

Another embodiment involves at least partially controlling a surface texture of the back surface of the donor optionally along with at least partially controlling a surface texture of the front surface, prior to imaging of the donor, in order to at least partially control surface texture of the transfer layer after having been transferred to the receptor.

Another embodiment involves at least partially controlling a surface texture of the of the transfer layer prior to LITI transfer. In other particular preferred embodiments the surface texture of the transfer layer is controlled, either by selection, or processing to be less than 10%, 5%, 2%, or 1% of the total thickness of the transfer layer. In other particular preferred embodiments the surface texture of the transfer layer is controlled such that for 5×5 micron area as determined with AFM, a roughness less than 1 nm ARq is preferred, more preferably less than 0.8 nm, and most preferred less than 0.5 nm.

Other surface treatments that may be used to affect roughness or surface texture of the donor, prior to imaging, are described in Strobel et al., "A Comparison of Corona-Treated and Flame-Treated Polypropylene Films," Plasmas and Polymers, Vol. 8, No. 1 (March 2003), which is incorporated herein by reference as if fully set forth. In a preferred embodiment, the roughness of at least one of the donor's substrate or coated layer's is controlled using at least one of these surface treatments. In a preferred embodiment, the roughness of at least one of the donor's substrate or coated layer's is controlled to be less than 1 nm ARq using AFM on a 5×5 micron scale, using at least one of these surface treatments.

While the present invention has been described in connection with an exemplary embodiment, it will be understood that many modifications will be readily apparent to those skilled in the art, and this application is intended to cover any adaptations or variations thereof. For example, various types of materials, constructions, and treatments of the donor may be used without departing from the scope of the invention. This invention should be limited only by the claims and equivalents thereof.

The following non-limiting examples further illustrate the present invention.

EXAMPLES

| Term | Meaning |
|---|---|
| BAlQ | Bis-(2-methyl-8-quinolato)-4-(phenyl-phenalato)-Aluminum, available from H. W. Sands Corp, Jupiter, FL |
| AlQ | Tris(8-hydroxyquinoline) aluminum available from H. W. Sands Corp, Jupiter, FL |
| LiF | Lithium fluoride, 99.85%, available from Alfa Aesar, Ward Hill, MA as product number 36359 |
| Al | Puratronic aluminum shots, 99.999%, available from Alfa Aesar, Ward Hill, MA |
| Ag | Silver (target available from Arconium, Providence RI) |
| ITO | Indium tin oxide |
| OEL | Organic electroluminescent |
| OLED | Organic light-emitting diode |
| LCD | Liquid Crystal Display |
| RPM | Revolutions per minute |
| Ebecryl 629 | Epoxy novolac acrylate available from UCB Radcure Inc., N. Augusta, SC |
| Irgacure 184 | 1-hydroxycyclohexyl phenyl ketone available from Ciba Specialty Chemicals Corporation, Tarrytown, NY, as Irgacure 184 |
| PET | Polyethylene terephthalate |
| PEDOT VP CH 8000 | A mixture of water and 3,4-polyethylenedioxythiophene-polystyrenesulfonate (cationic) available from H. C. Starck, Newton, MA |
| Elvacite 2669 | An acrylic resin available from ICI Acrylics Inc., Memphis, TN |
| Irgacure 369 | 2-benzyl-2-(dimethylamino)-1-(4-(morpholinyl)phenyl) butanone, available from Ciba Specialty Chemicals Corporation, Tarrytown, NY |
| MEK | Methyl Ethyl Ketone |
| PMA | 1-methoxy-2-propanol acetate |
| PM | 1-methoxy-2-propanol |
| UV | Ultraviolet |
| nm | Nanometer |
| kW | Kilowatt |
| um, μ | Micrometer/micron |
| kV | Kilovolt |
| sccm | Standard cubic centimeters per minute |
| AFM | Atomic Force Microscopy |
| SR 351HP | Trimethylolpropane triacrylate ester, available from Sartomer, Exton, PA as SR 351HP |
| LITI | Laser-induced thermal imaging |
| LTHC | Light-to-heat conversion |
| IL | Interlayer |
| Raven 760 Ultra | Carbon black pigment, available from Columbian Chemical Co., Atlanta, GA |
| Butvar B-98 | Polyvinyl butyrol resin, available from Solutia, Inc., St. Louis, MO |
| Joncryl 67 | Acrylic resin available from S. C. Johnson & Sons, Racine, WI |
| Disperbyk 161 | A dispersant available from Byk-Chemie, USA, Wallingford, CT |
| Wt. % | Weight percent |
| Ketjenblack EC600JD | Carbon black pigment, available from Akzo Nobel Polymer Chemicals, Chicago, Illinois |
| Vylon UR8300 | Urethane modified copolyester resin, available from DKSH North America, Inc, Baltimore, MD |
| BR-95 | Acrylic copolymer, available from Dianal America, Inc, Pasadena, TX |
| Aronix M-310 | Trimethylolpropane polypropylene glycol triacrylate, available from Toagosei America, Dublin, OH |
| HTM-001 | Hole transport material from Covion Organic Semiconductors, GmbH, Frankfurt, Germany |
| TMM-004 | Triplet Matrix Host Material from Covion Organic Semiconductors, GmbH, Frankfurt, Germany |
| TER-004 | Triplet Emitter Red, phosphorescent dye from Covion Organic Semiconductors, GmbH, Frankfurt, Germany |
| M7Q | PET film, 2.88 mil thickness available from DuPont Teijin Films, Hopewell, VA |
| OD | Optical Density |

Donor Descriptions:

Donor 1 (D1) was prepared in the following manner. An LTHC solution (LTHC-3), given in Table X1 was coated onto a 2.88 mil thick polyethylene terapthalate (PET) film substrate, specifically M7Q film (DuPont Teijin Films, Hopewell Va.). The LTHC solution at 17.5% solids in MEK/PMA/Toluene at a ratio of 30/50/20, respectively, was coated by a microgravure coating method using the Yasui Seiki Lab Coater, Model CAG-150 to achieve a dry thickness of approximately 1.2 microns. The coating was in-line dried and cured under ultraviolet (UV) radiation. The cured coating had an optical density of approximately 0.88 when measured using incident light having a wavelength of 1064 nm. An Interlayer solution (IL-1), given in Table Y1, at 20% solids in MEK/PM at a ratio of 60/40, respectively, was coated onto the LTHC layer by a microgravure coating method using the Yasui Seiki Lab Coater, Model CAG-150 to achieve a dry thickness of approximately 1.1 microns. The coating was in-line dried and cured under ultraviolet (UV) radiation.

TABLE X1

LTHC-3

| Trade Name | Supplier | Weight % of Solution (17.5% Solids) | Weight % of Solids (non-volatiles) | Primary designation |
|---|---|---|---|---|
| Ketjenblack EC600JD | Akzo Nobel | 2.09 | 11.96 | carbon black IR absorber |
| Vylon UR-8300 | Toyobo | 5.24 | 29.97 | urethane modified copolyester resin |
| Disperbyk 161 | Byk-Chemie USA | 1.69 | 9.64 | dispersant |
| Ebecryl 629 | UCB Chemicals | 7.87 | 44.95 | epoxy novolac acrylate diluted with TMPTA (trimethylolpropane triacrylate) and HEMA (2-hydroxy ethyl methacrylate) |
| Irgacure 369 | Ciba Specialty Chemicals | 0.53 | 3.03 | photoinitiator |
| Irgacure 184 | Ciba Specialty Chemicals | 0.08 | 0.45 | photoinitiator |
| toluene | | 16.5 | | |
| 2-butanone (MEK) | | 24.75 | | |
| 1-methoxy-2-propanol acetate (PMA) | | 41.25 | | |
| Total | | 100.00 | 100.00 | |

TABLE Y1

IL-1

| Trade Name | Supplier | Weight % of Solution (20% Solids) | Weight % of Solids (non-volatiles) | Primary designation |
|---|---|---|---|---|
| Butvar B-98 | Solutia | 0.93 | 4.64 | polyvinyl butyral resin |
| Joncryl 67 | Johnson Polymer | 2.78 | 13.92 | modified styrene acrylic polymer |
| SR351HP | Sartomer | 14.85 | 74.24 | trimethylolpropane triacrylate |
| Irgacure 369 | Ciba Specialty Chemicals | 1.25 | 6.27 | photoinitiator |
| Irgacure 184 | Ciba Specialty Chemicals | 0.19 | 0.93 | photoinitiator |
| 1-methoxy-2-propanol (PM) | | 32.00 | | |
| 2-butanone (MEK) | | 48.00 | | |
| | | 100.00 | 100.00 | |

Donor 2 (D2) was prepared in the following manner. An LTHC solution (LTHC-2), given in Table X2 was coated onto a 2.88 mil thick polyethylene terapthalate (PET) film substrate specifically M7Q film (DuPont Teijin Films, Hopewell Va.) The LTHC solution at 16% solids in MEK/PMA at a ratio of 62.5/37.5, respectively, was coated by a die coating method in order to achieve a dry thickness of approximately 1.2 microns. The coating was in-line dried and cured under ultraviolet (UV) radiation. The cured coating had an optical density of approximately 0.88 when measured using incident light having a wavelength of 1064 nm. An Interlayer solution, given in Table Y2, was coated at 23% solids in MEK/PM at a ratio of 60/40, respectively, onto the LTHC layer by a die coating method to achieve a dry thickness of approximately 1.1 microns. The coating was in-line dried and cured under ultraviolet (UV) radiation.

TABLE X2

LTHC-2

| Trade Name | Supplier | Weight % of Solution (16% Solids) | Weight % of Solids (non-volatiles) | Primary designation |
|---|---|---|---|---|
| Raven 760 | Columbian Chemicals Co. | 3.30 | 20.62 | carbon black IR absorber |
| Butvar B-98 | Solutia | 0.59 | 3.68 | polyvinyl butyral resin |
| Joncryl 67 | Johnson Polymer | 1.76 | 11.00 | modified styrene acrylic polymer |
| Disperbyk 161 | Byk-Chemie USA | 0.30 | 1.86 | dispersant |
| Ebecryl 629 | UCB Chemicals | 5.76 | 36.03 | epoxy novolac acrylate diluted with TMPTA (trimethylolpropane triacrylate) and HEMA (2-hydroxy ethyl methacrylate) |
| Elvacite 2669 | Lucite International | 3.84 | 24.02 | acrylic resin |
| Irgacure 369 | Ciba Specialty Chemicals | 0.39 | 2.43 | photoinitiator |
| Irgacure 184 | Ciba Specialty Chemicals | 0.06 | 0.36 | photoinitiator |
| 2-butanone (MEK) | | 52.50 | | |
| 1-methoxy-2-propanol acetate (PMA) | | 31.50 | | |
| Total | | 100.00 | 100.00 | |

TABLE Y2

IL-2

| Trade Name | Supplier | Weight % of Solution (23% Solids) | Weight % of Solids (non-volatiles) | Primary designation |
|---|---|---|---|---|
| Butvar B-98 | Solutia | 1.07 | 4.64 | polyvinyl butyral resin |
| Joncryl 67 | Johnson Polymer | 3.20 | 13.92 | modified styrene acrylic polymer |
| SR351HP | Sartomer | 17.08 | 74.24 | trimethylolpropane triacrylate |
| Irgacure 369 | Ciba Specialty Chemicals | 1.44 | 6.27 | photoinitiator |
| Irgacure 184 | Ciba Specialty Chemicals | 0.21 | 0.93 | photoinitiator |
| 1-methoxy-2-propanol (PM) | | 30.80 | | |
| 2-butanone (MEK) | | 46.20 | | |
| | | 100.00 | 100.00 | |

Donor 3 (D3) was prepared in the following manner. An LTHC solution (LTHC-1), given in Table X3 was coated onto a 2.88 mil thick polyethylene terapthalate (PET) film substrate specifically M7Q film (DuPont Teijin Films, Hopewell Va.). The LTHC solution at 20% solids in MEK/PMA at a ratio of 62.5/37.5, respectively, was coated by a microgravure coating method using a Yasui Seiki Lab Coater, Model CAG-150, in order to achieve a dry thickness of approximately 1.2 microns. The coating was in-line dried and cured under ultraviolet (UV) radiation. The cured coating had an optical density of approximately 0.87 when measured using incident light having a wavelength of 1064 nm. An Interlayer solution, given in Table Y1, was coated at 20% solids in MEK/PM at a ratio of 60/40, respectively, onto the LTHC layer by a microgravure coating method using the Yasui Seiki Lab Coater, Model CAG-150 to achieve a dry thickness of approximately 1.1 microns. The coating was in-line dried and cured under ultraviolet (UV) radiation.

TABLE X3

LTHC-1

| Trade Name | Supplier | Weight % of Solution (20% Solids) | Weight % of Solids (non-volatiles) | Primary designation |
| --- | --- | --- | --- | --- |
| Raven 760 | Columbian Chemicals Co. | 4.12 | 20.62 | carbon black IR absorber |
| Butvar B-98 | Solutia | 0.74 | 3.68 | polyvinyl butyral resin |
| Joncryl 67 | Johnson Polymer | 2.20 | 11.00 | modified styrene acrylic polymer |
| Disperbyk 161 | Byk-Chemie USA | 0.37 | 1.86 | dispersant |
| Ebecryl 629 | UCB Chemicals | 7.21 | 36.03 | epoxy novolac acrylate diluted with TMPTA (trimethylolpropane triacrylate) and HEMA (2-hydroxy ethyl methacrylate) |
| Elvacite 2669 | Lucite International | 4.80 | 24.02 | acrylic resin |
| Irgacure 369 | Ciba Specialty Chemicals | 0.49 | 2.43 | photoinitiator |
| Irgacure 184 | Ciba Specialty Chemicals | 0.07 | 0.36 | photoinitiator |
| 2-butanone (MEK) | | 50 | | |
| 1-methoxy-2-propanol acetate (PMA) | | 30 | | |
| Total | | 100.00 | 100.00 | |

Donor 4 (D4) was prepared in the following manner. An LTHC solution (LTHC-4), given in Table X4 was coated onto a 2.88 mil thick polyethylene terapthalate (PET) film substrate specifically M7Q film (DuPont Teijin Films, Hopewell Va.). The LTHC solution at 27.5% solids in MEK/PMA at a ratio of 62.5/37.5, respectively, was coated by a microgravure coating method using the Yasui Seiki Lab Coater, Model CAG-150 to achieve a dry thickness of approximately 2.7 microns. The coating was in-line dried and cured under ultraviolet (UV) radiation. The cured coating had an optical density of approximately 1.18 when measured using incident light having a wavelength of 1064 nm. An Interlayer solution (IL-1), given in Table Y1, was coated at 20% solids in MEK/PM at a ratio of 60/40, respectively onto the LTHC layer by a microgravure coating method using the Yasui Seiki Lab Coater, Model CAG-150 to achieve a dry thickness of approximately 1.8 microns. The coating was in-line dried and cured under ultraviolet (UV) radiation.

TABLE X4

LTHC-4

| Trade Name | Supplier | Weight % of Solution (27.5% Solids) | Weight % of Solids (non-volatiles) | Primary designation |
| --- | --- | --- | --- | --- |
| Raven 760 | Columbian Chemicals Co. | 3.56 | 12.96 | carbon black IR absorber |
| Butvar B-98 | Solutia | 0.64 | 2.31 | polyvinyl butyral resin |
| Joncryl 67 | Johnson Polymer | 1.90 | 6.91 | modified styrene acrylic polymer |
| Disperbyk 161 | Byk-Chemie USA | 0.32 | 1.17 | dispersant |
| Ebecryl 629 | UCB Chemicals | 12.09 | 43.95 | epoxy novolac acrylate diluted with TMPTA (trimethylolpropane triacrylate) and HEMA (2-hydroxy ethyl methacrylate) |
| Elvacite 2669 | Lucite International | 8.06 | 29.30 | acrylic resin |
| Irgacure 369 | Ciba Specialty Chemicals | 0.82 | 2.97 | photoinitiator |
| Irgacure 184 | Ciba Specialty Chemicals | 0.12 | 0.44 | photoinitiator |
| 2-butanone (MEK) | | 45.31 | | |
| 1-methoxy-2-propanol acetate (PMA) | | 27.19 | | |
| Total | | 100.00 | 100.00 | |

Donor 5 (D5) was prepared in the same manner as Donor 4 (D4) which was then coated with a Silicon:Aluminum layer. A Si—Al alloy layer was deposited by planar magnetron sputtering in a vacuum coater from an alloy target of 90% Si:10% Al, under the following conditions: sputter power of 0.76 KW, source voltage of 543 volts, and Argon flow of 17 sccm to achieve a thickness of approximately 40 nm.

Donor 6 (D6) was prepared in the same manner as Donor 4 (D4) which was then coated with a Silicon:Aluminum layer. A Si—Al alloy layer was then deposited by planar magnetron sputtering in a vacuum coater from an alloy target of 90% Si:10% Al, under the following conditions: sputter power of 0.76 KW, source voltage of 543 volts, and Argon flow of 17 sccm to achieve a thickness of approximately 70 nm.

Example 1—Control of Donor Surface Texture

In preparing a small molecule device stack, transferring the emissive layer can be accomplished with donors of varying roughness. The roughness of the donor, prior to imaging, can impact the transfer layer roughness after having been transferred, which can impact the efficiency of the device. The process and materials used to build LITI devices are described below.

Receptor substrates were prepared by using 0.7 mm thick glass with photolithography-patterned ITO (Indium tin oxide) as the substrate. The substrate was spin coated with Baytron P VP CH8000 (H.C. Starck, Newton, Mass.) in order to achieve a dry thickness of approximately 60 nm and then heated to 200° C. for 5 minutes in a nitrogen purged oven. The coated substrate was then spin coated with a solution of HTM-001 (a hole transporting polymer from Covion Organic Semiconductors GmbH, Frankfurt, Germany), and toluene while in an argon purged glove box to achieve a dry thickness of approximately 100 nm. Finally, an approximate 20 nm layer of spiro-TAD (Covion Organic Semiconductors GmbH, Frankfurt, Germany) was vacuum coated using a standard thermal evaporation procedure in a Balzers vacuum chamber at a background pressure of $10^{-7}$ Torr on the top to finish the receptor structure.

The surface roughness of the release surface (interlayer) on Donors 1, 2 and 3 was systematically varied prior to imaging. The constructions of Donors 1, 2 and 3 were described above.

The interlayers of all the donor films were vacuum coated using a standard thermal evaporation procedure in a Balzers vacuum chamber at a background pressure of $10^{-7}$ Torr with co-evaporation of the host and dye controlled to achieve the desired 30 nm thick layers of TMM004, a Covion proprietary OLED host, doped with 9 weight percent Irppy (iridium trisphenyl pyridine(Irppy), a green phosphorescent dye). The host/dye system was subsequently transferred from the donor sheet to the receptor surface using laser induced thermal imaging (LITI). Donors 1, 2 and 3 were all separately imaged to the above described individual multilayer receptor substrates. Each donor was imaged from the back side of the substrate using one single-mode Nd:YAG laser at a power of 1 watt at the imaging plane. Scanning was performed using a system of linear galvanometers, with the laser beam focused onto the image plane using an f-theta scan lens as part of a near-telecentric configuration. The laser spot size, measured at $1/e^2$ intensity was 18×250 microns. A unidirectional scan was used with a triangle dither pattern and a frequency of 400 KHz. Requested linewidths were 110 micron with a pitch of 165 microns.

Device fabrication was completed by successively vacuum coating the following stack: Balq(100A)/Alq(200A)/LiF(7A)/Al(40A)/Ag(4000A) onto the LITI imaged receptor using a standard thermal evaporation procedure in a Balzers vacuum chamber at a background pressure of $10^{-7}$ Torr. The devices were encapsulated and tested for resultant light, current, and voltage characteristics.

In order to characterize the texture of the release layers of the various donors, prior to imaging, tapping mode atomic force microscopy (AFM) was used. The resultant surface texture of the LITI transferred images on the device receptors were similarly characterized by tapping mode AFM analyses. Area profiling on a 5 microns by 5 microns area was conducted using a Digital Instruments Dimension 5000 SPM instrument. The root mean square (ARq), average ($AR_a$), and the peak-to-valley maximum distance ($AR_t$) were determined for a series of images on a size scale of 5 microns by 5 microns taken with a resolution of 512 by 512 pixels.

Data below shows the correspondence between the roughness of the release surface on the donor interlayer coating before coating the transfer layer and resultant roughness of the transferred stack after LITI patterning.

Table 1 provides data for a smooth donor prior to coating the transfer layer and the resulting transfer layer on top of the receptor coated stack. A continuous transfer layer was seen with low roughness, corresponding to the low roughness of the donor film surface.

TABLE 1

Image Statistics for sample no. D1

| | Transfer Layer Surface | Uncoated Donor |
|---|---|---|
| Img. ARq (nm) | 0.446 | 0.317 |
| Img. ARa (nm) | 0.349 | 0.253 |
| Img. ARt (nm) | 13.041 | 3.996 |

In contrast, the data in Table 2 shows a donor with significant roughness and the resulting transfer layer.

TABLE 2

Image Statistics for sample no. D2

| | Transfer Layer Surface | Uncoated Donor |
|---|---|---|
| Img. ARq (nm) | 12.341 | 3.149 |
| Img. ARa (nm) | 10.676 | 2.542 |
| Img. ARt (nm) | 123.94 | 21.941 |

The transfer layer corresponding with the data in Table 2 was characterized by large areas of discontinuity, where transfer material was not patterned onto the receptor.

Finally, rough but continuous transfer was seen for a donor with a series of high points scattered throughout the surface, as shown in Table 3.

TABLE 3

Image Statistics for sample no. D3

| | Transfer Layer Surface | Uncoated Donor |
|---|---|---|
| Img. ARq (nm) | 1.630 | 3.953 |
| Img. ARa (nm) | 1.166 | 2.894 |
| Img. ARt (nm) | 26.578 | 40.345 |

The transfer layer corresponding with the data in Table 3 has significant roughness present, as characterized by the RMS roughness and the visual appearance in the AFM image.

To compare the effect of roughness on the performance of OLED devices, the cathode side structure was applied to transfer layer systems and the light output was measured as a function of driving current. The voltages achieved were also measured.

Figure 5A:
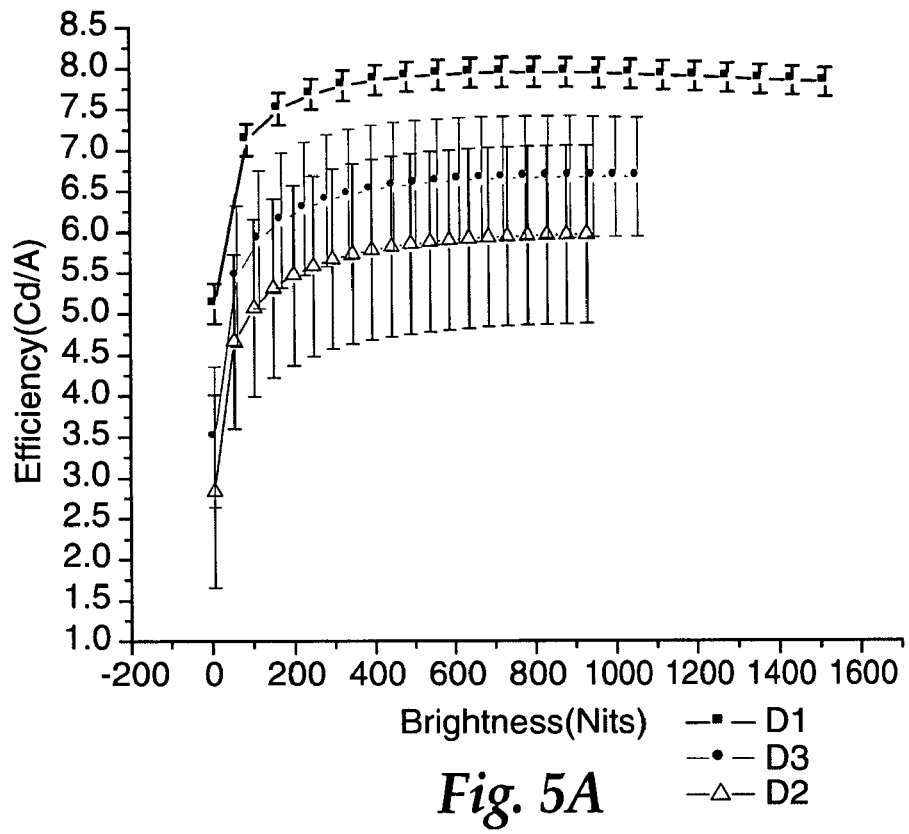
FIGS. 5A and 5B illustrate efficiency as a function of roughness for particular donor samples.
Figure 5B:
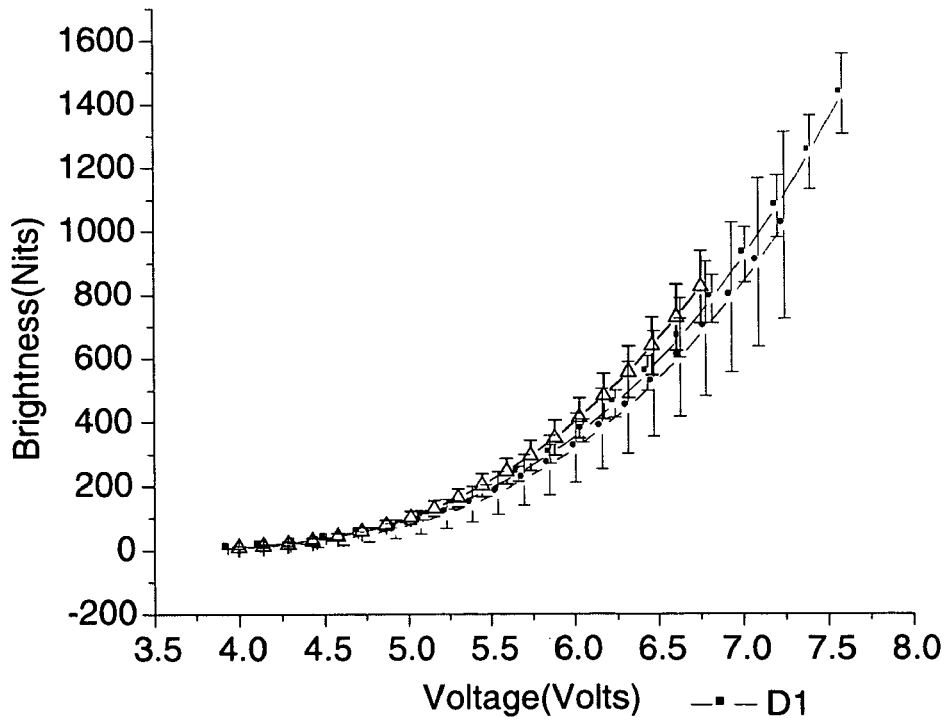

The data in the table below represents the average of a number of pixels from a number of substrates. The data in the graphs of FIGS. 5A and 5B corresponds with the tables above according to the identifiers for the samples. The light-to-current efficiency (Cd/A) is seen to correlate inversely with roughness of the transfer layer. The variability also is seen to depend on the roughness. In the case of the discontinuous transfer system, prepared with donor D2, blue light emission was observed, particularly in regions where holes existed in the transfer layer.

| Donor ID | Efficiency Cd/A at 500 nits | Transfer Layer Roughness Ara(nm) | Uncoated Donor Ara(nm) |
| --- | --- | --- | --- |
| D1 | 7.75 | 0.349 | 0.253 |
| D2 | 5.9 | 10.7 | 2.54 |
| D3 | 6.5 | 1.17 | 2.89 |

Example 2—Control of Transfer Layer Roughness with an Interlayer Having a Different Texture In this example, smooth donors were prepared by depositing a smooth inorganic layer on the surface of a typical LTHC/IL donor construction. Modification of the surface chemistry can be advantageous to control the release of the transfer layer from the donor after patterning, as well as the surface texture of the transfer layer. The process and materials used to build LITI devices are described below.

Receptor substrates were prepared by using 0.7 mm thick glass with photolithography-patterned ITO (Indium tin oxide) as the substrate. The substrate was spin coated with Baytron P VP CH8000 (H.C. Starck, Newton, Mass.) in order to achieve a dry thickness of approximately 60 nm and then heated to 200° C. for 5 minutes in a nitrogen purged oven. The coated substrate was then spin coated with a solution of HTM-001 (a hole transporting polymer from Covion Organic Semiconductors GmbH, Frankfurt, Germany), and toluene while in an argon purged glove box to achieve a dry thickness of approximately 100 nm. Finally, a 20 nm layer of spiro-TAD (Covion Organic Semiconductors GmbH, Frankfurt, Germany) was vacuum coated using a standard thermal evaporation procedure in a Balzers vacuum chamber at a background pressure of $10^{-7}$ Torr on the top to finish the receptor structure.

The donor texture was modified by sputtering a thin layer of silicon/aluminum alloy onto the surface of a solution coated LTHC/IL composition, Donor 4 (D4). The Si—Al alloy layer was deposited by planar magnetron sputtering in a vacuum coater from an alloy target of 90% Si:10% Al, under the following conditions: sputter power of 0.76 KW, source voltage of 543 volts, and Argon flow of 17 sccm. The resulting donor films, Donor 5 and Donor 6 (D5 and D6), had a low RMS surface texture consisting of fine silicon spheres.

Each donor film (Donor 4, Donor 5 and Donor 6) was vacuum coated using a standard thermal evaporation procedure in a Balzers vacuum chamber at a background pressure of $10^{-7}$ Torr with co-evaporation of TMM004, a Covion proprietary OLED host, doped with 9 weight percent TER004, a red Covion proprietary phosphorescent dye to achieve a 30 nm thick transfer layer. The host/dye system was subsequently transferred from the donor sheet to the receptor surface using laser induced thermal imaging. Each donor was imaged from the back side of the substrate using one single-mode Nd:YAG laser at a power of 1 watt at the imaging plane. Scanning was performed using a system of linear galvanometers, with the laser beam focused onto the image plane using an f-theta scan lens as part of a near-telecentric configuration. The laser spot size, measured at $1/e^2$ intensity was 18×250 microns. A unidirectional scan was used with a triangle dither pattern and a frequency of 400 KHz. Requested linewidths were 110 micron with a pitch of 165 microns.

Device fabrication was completed by successively vacuum coating the following stack: Balq(100A)/Alq(200A)/LiF (7A)/Al(40A)/Ag(4000A) onto the LITI imaged receptor using a standard thermal evaporation procedure in a Balzers vacuum chamber at a background pressure of $10^{-7}$ Torr. The devices were encapsulated and tested for resultant light, current, and voltage characteristics.

In order to characterize the texture of the release layers of the various donors, prior to imaging, tapping mode atomic force microscopy (AFM) was used. The resultant surface texture of the LITI transferred images on the device receptors were similarly characterized by tapping mode AFM analyses. Area profiling on a 5 microns by 5 microns area was conducted using a Digital Instruments Dimension 5000 SPM instrument. The root mean square (ARq), average ($AR_a$), and the peak-to-valley maximum distance ($AR_t$) were determined for a series of images on a size scale of 5 microns by 5 microns taken with a resolution of 512 by 512 pixels.

Data below shows the correspondence between the roughness of the release surface on the donor interlayer coating before coating the transfer layer and resultant roughness of the transferred stack after LITI patterning. Tables 8, 9 and 10 provide data for a smooth donor prior to coating the transfer layer and the resulting transfer layer on top of the stack. A continuous transfer layer was seen with low roughness, corresponding to the low roughness of the donor film surface.

TABLE 8

Imaging Statistics for Sample No. D4

|  | Transfer Layer Surface | Uncoated Donor |
| --- | --- | --- |
| ARq(nm) | 0.466 | 0.64 |
| Ara(nm) | 0.364 | 0.39 |
| Art(nm) | 8.057 | 22 |

TABLE 9

Imaging Statistics for Sample No. D5

|  | Transfer Layer Surface | Uncoated Donor |
| --- | --- | --- |
| ARq(nm) | 0.465 | 0.51 |
| Ara(nm) | 0.362 | 0.405 |
| Art(nm) | 13.17 | 4.934 |

TABLE 10

Imaging Statistics for Sample No. D6

|  | Transfer Layer Surface | Uncoated Donor |
| --- | --- | --- |
| ARq(nm) | 0.495 | 0.566 |
| Ara(nm) | 0.388 | 0.441 |
| Art(nm) | 9.961 | 14.746 |

Differences were seen in the electroluminescent light output of the LITI devices. Devices prepared without a silicon/aluminum sputtered layer showed more visual defects which appeared as darker areas of emission compared to those made with the added donor layer. Current-voltage-brightness characterization of the LITI device also showed greater luminescent efficiencies for LITI devices prepared with the silicon/aluminum alloy.

Example 3—Control of Donor Surface Texture by Sheeting Method

In this example the film substrate is a 2.88 mil PET film, more specifically M7Q (DuPont Teijin Films, Hopewell, Va.). The substrate includes a front surface on which is coated the optional LTHC and other optional layers. The substrate back surface is the surface opposite that front surface and is the side through which the donor is imaged. The donor film can be wound in roll form as a convenient way to store and ship the film; however, when the donor film is rolled up, the back surface of the substrate can emboss other layers due to the pressure of the substrate back surface against other layers in the roll. The roughness of the substrate back surface can be controlled by a variety of techniques such as coating it with a transparent material to impart smoothness and still allow imaging or other techniques as described in the present specification. Preferably, the roughness distribution of the substrate back surface is the same or less than the roughness distribution of the substrate front surface, using an average roughness measurement, to avoid adverse effects of embossing of the coating when the donor is rolled up.

One way to control changes in the top layer texture is to use the method of sheeting the donor film without rolling up the donor film. In order to characterize the change in surface texture these two storage methods can impart to one or more of the coatings, tapping mode atomic force microscopy (AFM) was used to compare the surface texture of the same donor construction without a transfer layer prior to any imaging, Donor 7 (D7), that had been sheeted versus stored in roll form. Area profiling on a 75 microns by 75 microns area was conducted using a Digital Instruments Dimension 5000 SPM. The root mean square ($ARq$), average ($AR_a$), and the peak-to-valley maximum distance ($AR_t$) were determined for a series of images on a size scale of 75 microns by 75 microns taken with a resolution of 512 by 512 pixels.

Tables 11 and 12, below show the modifications to surface texture that can occur from storing the donor film wound in roll form where there is the possibility of a rough back surface of the film to come into contact with the donor coatings and impart certain surface textures.

TABLE 11

Imaging Statistics for Sample No. D7 Sheeted

| | Donor |
|---|---|
| ARq(nm) | 1.086 |
| Ara(nm) | 0.871 |
| Art(nm) | 10.829 |

TABLE 12

Imaging Statistics for Sample No. D7 Roll Form

| | Donor |
|---|---|
| ARq(nm) | 5.479 |
| Ara(nm) | 2.878 |
| Art(nm) | 254.20 |

The donor construction for Donor 7 is described below. Donor 7 (D7) was prepared in the following manner. An LTHC solution (LTHC-5), given in Table X5 was coated onto a 2.88 mil thick polyethylene terapthalate (PET) film substrate, specifically M7Q film (DuPont Teijin Films, Hopewell Va.) The LTHC solution at 20.5% solids in MEK/PMA at a ratio of 62.5/37.5, respectively, was coated by a die coating method in order to achieve a dry thickness of approximately 1.2 microns. The coating was in-line dried and cured under ultraviolet (UV) radiation. The cured coating had an optical density of approximately 1.2 when measured using incident light having a wavelength of 1064 nm. An Interlayer solution, IL-3, given in Table Y3, was coated at 12% solids in isopropyl acetate/isopropanol at a ratio of 67/33, respectively, onto the LTHC layer by a die coating method to achieve a dry thickness of approximately 1.1 microns. The coating was in-line dried and cured under ultraviolet (UV) radiation.

TABLE X5

LTHC-5

| Trade Name | Supplier | Weight % of Solution (20.5% Solids) | Weight % of Solids (non-volatiles) | Primary designation |
|---|---|---|---|---|
| Raven 760 | Columbian Chemicals Co. | 2.66 | 12.96 | carbon black IR absorber |
| Butvar B-98 | Solutia | 0.47 | 2.31 | polyvinyl butyral resin |
| Joncryl 67 | Johnson Polymer | 1.42 | 6.91 | modified styrene acrylic polymer |
| Disperbyk 161 | Byk-Chemie USA | 0.24 | 1.17 | dispersant |
| Ebecryl 629 | UCB Chemicals | 9.01 | 43.95 | epoxy novolac acrylate diluted with TMPTA (trimethylolpropane triacrylate) and HEMA (2-hydroxy ethyl methacrylate) |
| Elvacite 2669 | Lucite International | 6.01 | 29.30 | acrylic resin |
| Irgacure 369 | Ciba Specialty Chemicals | 0.61 | 2.97 | photoinitiator |
| Irgacure 184 | Ciba Specialty Chemicals | 0.09 | 0.44 | photoinitiator |
| 2-butanone | JT Baker | 49.69 | | |

TABLE X5-continued

| | | LTHC-5 | | |
|---|---|---|---|---|
| Trade Name | Supplier | Weight % of Solution (20.5% Solids) | Weight % of Solids (non-volatiles) | Primary designation |
| 1-methoxy-2-propanol acetate | | 29.81 | — | |
| Total | | 100.00 | 100.00 | |

TABLE Y3

| | | IL-3 | | |
|---|---|---|---|---|
| Trade Name | Supplier | Weight % of Solution (12% Solids) | Weight % of Solids (non-volatiles) | Primary designation |
| BR-95 | Dianal America, Inc. | 2.22 | 18.50 | acrylic copolymer |
| Aronix M-310 | Toagosei America, Inc | 9.26 | 77.14 | trimethylolpropane polypropylene glycol triacrylate |
| Irgacure 369 | Ciba Specialty Chemicals | 0.52 | 4.37 | photoinitiator |
| isopropyl acetate | | 58.96 | | |
| isopropanol | | 29.04 | | |
| | | 100.00 | 100.00 | |

Example 4—Conductivity of Donor Film

The conductivity of various donor sheets were measured and are shown below. Surface resistivities, a measure of the ability of a surface to dissipate static charge, on donor films were measured using a ProStat (Bensenville, Ill.) PRS-801 resistance system equipped with a PRF-911 concentric ring fixture. Surface resistivities in ohms were converted to ohms/sq by multiplying the measured values by 10 according to the documentation supplied with the instrument. Values are in below table for each sample tested. Static decay times of donor films were measured on an Electro-Tech Systems (Glenside, Pa.) Model 406C static decay meter. Film samples approximately five inches on a side were cut and mounted between the meter electrodes using magnets. The sample was charged to +/−5 kV, and the time for the charge to decay to 10% of its initial value was measured.

TABLE 4

Summary of Surface Resistivity and Static Decay Values for Various Constructions

| Description | LTHC# | IL# | Surface Resistivity ohm/square | Static Decay (sec) |
|---|---|---|---|---|
| PET substrate | — | — | 2.9 E13 | Infinity |
| LTHC only on PET | 2 | — | 1.6 E14 | would not charge |
| LTHC/IL | 2 | 4 | 3.3 E14 | |
| LTHC/IL | 2 | 2 | 4.6 E14 | |
| LTHC only | 6 | — | 4.7 E5 | 0 |
| LTHC/IL | 6 | 2 | 7.7 E11 | 0.01 |
| LTHC/IL | 6 | 4 | 1.0 E12 | 0.01 |
| LTHC only | 7 | — | 3.8 E9 | |
| LTHC/IL | 7 | 4 | 1.1 E12 | |
| LTHC only | 4 | — | 1.1 E13 | would not charge |
| LTHC/IL | 4 | 5 | 3.3 E13 | |
| LTHC only | 4 | 1 | 3.4 E13 | |

Donor constructions described in table above were coated by gravure coating or die coating techniques as described in previous examples. For those LTHC and IL formulations not previously described, formulations are listed below with target thickness and Optical Density at 1064 nm.

TABLE Y4

| | | IL-4 (Target thickness: approx. 1.1 micron) | | |
|---|---|---|---|---|
| Trade Name | Supplier | Weight % of Solution (12% Solids) | Weight % of Solids (non-volatiles) | Primary designation |
| BR-95 | Dianal America, Inc. | 2.22 | 18.50 | acrylic copolymer |
| Aronix M-310 | Toagosei America, Inc | 9.26 | 77.14 | trimethylolpropane polypropylene glycol triacrylate |
| Irgacure 369 | Ciba Specialty Chemicals | 0.52 | 4.37 | photoinitiator |
| isopropyl acetate | | 88.00 | | |
| | | 100.00 | 100.00 | |

TABLE Y5

IL-5 (Target thickness: approx. 1.1 micron)

| Trade Name | Supplier | Weight % of Solution (18% Solids) | Weight % of Solids (non-volatiles) | Primary designation |
|---|---|---|---|---|
| BR-95 | Dianal America, Inc. | 3.33 | 18.50 | acrylic copolymer |
| Aronix M-310 | Toagosei America, Inc | 13.88 | 77.14 | trimethylolpropane polypropylene glycol triacrylate |
| Irgacure 369 | Ciba | 0.79 | 4.37 | photoinitiator |
| isopropyl acetate | Specialty Chemicals | 82.00 | | |
| | | 100.00 | 100.00 | |

TABLE X6

LTHC-6 (Target thickness: 1.2 microns/Target OD of LTHC coating at 1064 nm: 0.88)

| Trade Name | Supplier | Weight % of Solution (13% Solids) | Weight % of Solids (non-volatiles) | Primary designation |
|---|---|---|---|---|
| Ketjenblack EC600JD | Akzo Nobel | 1.55 | 11.96 | carbon black IR absorber |
| Vylon UR-8300 | Toyobo | 3.90 | 29.97 | urethane modified copolyester resin |
| Disperbyk 161 | Byk-Chemie USA | 1.25 | 9.64 | dispersant |
| Ebecryl 629 | UCB Chemicals | 5.84 | 44.95 | epoxy novolac acrylate diluted with TMPTA (trimethylolpropane triacrylate) and HEMA (2-hydroxy ethyl methacrylate) |
| Irgacure 369 | Ciba Specialty Chemicals | 0.39 | 3.03 | photoinitiator |
| Irgacure 184 | Ciba Specialty Chemicals | 0.06 | 0.45 | photoinitiator |
| toluene | | 17.40 | | |
| 2-butanone (MEK) | | 26.10 | | |
| 1-methoxy-2-propanol acetate (PMA) | | 43.50 | | |
| Total | | 100.00 | 100.00 | |

TABLE X7

LTHC-7 (Target thickness: 2.7 microns/Target OD at 1064 nm: 1.18)

| Trade Name | Supplier | Weight % of Solution (18% Solids) | Weight % of Solids (non-volatiles) | Primary designation |
|---|---|---|---|---|
| Ketjenblack EC600JD | Akzo Nobel | 1.37 | 7.62 | carbon black IR absorber |
| Vylon UR-8300 | Toyobo | 5.93 | 32.96 | urethane modified copolyester resin |
| Disperbyk 161 | Byk-Chemie USA | 1.11 | 6.14 | dispersant |
| Ebecryl 629 | UCB Chemicals | 8.90 | 49.44 | epoxy novolac acrylate diluted with TMPTA (trimethylolpropane triacrylate) and HEMA (2-hydroxy ethyl methacrylate) |
| Irgacure 369 | Ciba Specialty Chemicals | 0.60 | 3.34 | photoinitiator |
| Irgacure 184 | Ciba Specialty Chemicals | 0.09 | 0.49 | photoinitiator |

TABLE X7-continued

LTHC-7 (Target thickness: 2.7 microns/Target OD at 1064 nm: 1.18)

| Trade Name | Supplier | Weight % of Solution (18% Solids) | Weight % of Solids (non-volatiles) | Primary designation |
|---|---|---|---|---|
| toluene | | 16.40 | | |
| 2-butanone (MEK) | | 24.60 | | |
| 1-methoxy-2-propanol acetate (PMA) | | 41.00 | | |
| | Total | 100.00 | 100.00 | |

Donor constructions containing LTHC-6 or LTHC-7 resulted in lower resistivity measurements (more conductive) and quick static decay times. Because of these characteristics, these LTHC donor constructions typically result in more uniform coating when overcoating with an Interlayer and are less susceptible to particle/dust induced defects due to their ability to quickly dissipate charge. It has been observed that donor constructions containing LTHC-2 or LTHC-4 are more likely to result in non-uniform Interlayer coatings and also quickly attract unwanted dust particles to the surface of the film due to its inability to dissipate static charge. For donor constructions with an LTHC and Interlayer coating, it is preferred to have a surface resistivity of 10 E12 or less in order to minimize dust particles from being attracted to the surface of the coating. It is also preferred to have a static decay time of 0.01 seconds or less.

The invention claimed is:

1. A process for transferring an image onto a receptor comprising the steps of:
   providing on a substrate a light-to-heat conversion layer, an interlayer coated on the light-to-heat conversion layer, and a thermal transfer layer coated on the interlayer, wherein the interlayer comprises metal;
   placing the thermal transfer layer in contact with a surface of the receptor;
   irradiating the light-to-heat conversion layer in an imagewise pattern with a light source to thermally transfer portions of the thermal transfer layer corresponding to the imagewise pattern to the receptor; and
   controlling, at least partially, a surface texture of the transfer layer prior to the placing step and prior to imaging of the transfer layer, wherein the controlling step includes selecting coating conditions for the light-to-heat conversion layer and the interlayer in the providing step in order to control the surface texture of the transfer layer.

2. The process of claim 1, wherein the interlayer comprises silver.

3. The process of claim 1, wherein the controlling step includes using a particular thickness of the transfer layer prior to the place step and prior to the imaging.

4. The process of claim 1, further including the step of controlling a uniformity in the coating of the interlayer.

* * * * *